United States Patent [19]
Sung et al.

[11] Patent Number: 6,044,018
[45] Date of Patent: Mar. 28, 2000

[54] SINGLE-POLY FLASH MEMORY CELL FOR EMBEDDED APPLICATION AND RELATED METHODS

[75] Inventors: Kuo-Tung Sung, Hsinchu; Huoy-Jong Wu, Taichung, both of Taiwan

[73] Assignee: Mosel Vitelic, Inc., Hsinchu, Taiwan

[21] Appl. No.: 09/107,172

[22] Filed: Jun. 17, 1998

[51] Int. Cl.[7] .................................................... G11C 16/04
[52] U.S. Cl. ................................. 365/185.18; 365/185.1; 365/185.26; 365/185.33
[58] Field of Search ..................... 365/185.18, 185.26, 365/185.33, 185.1, 185.05

[56] References Cited

U.S. PATENT DOCUMENTS

| | | |
|---|---|---|
| 4,935,790 | 6/1990 | Cappelletti et al. .................. 357/23.5 |
| 5,301,150 | 4/1994 | Sullivan et al. ......................... 365/185 |
| 5,331,590 | 7/1994 | Josephson et al. ..................... 365/182 |
| 5,418,390 | 5/1995 | Wang ...................................... 257/321 |
| 5,465,231 | 11/1995 | Ohsaki ................................ 365/185.33 |
| 5,684,739 | 11/1997 | Takeuchi ............................. 365/185.03 |
| 5,694,356 | 12/1997 | Wong et al. ........................ 365/185.03 |
| 5,898,614 | 4/1999 | Takeuchi ................................ 365/185.1 |

OTHER PUBLICATIONS

Katsuhiko Ohsaki, et al. A Single Poly EEPROM Cell Structure for Use in Standard CMOS Processes, *IEEE Journal of Solid–State Circuits,* vol. 29, No. 3. 311–316 (Mar. 1994).

*Primary Examiner*—David Nelms
*Assistant Examiner*—Gene N. Auduong
*Attorney, Agent, or Firm*—Townsend and Townsend and Crew LLP

[57] ABSTRACT

A single-poly flash memory cell manufacturable by a standard CMOS fabrication process. A NMOS floating gate (32) is electrically connected to a PMOS floating gate (34). Both gates are fabricated in a single polysilicon process and form a flash memory cell. The floating gates are programmed by Vcc to the source (14) and drain (26) of the NMOS device (28), while applying about −Vcc to the source (20) of the PMOS device (30). Band-to-band hot electrons charge the floating gates. Biasing the NMOS device to operate as a FET allows the charge state of the gate to be sensed from the source current drawn. The memory cell is erased by applying a moderately high voltage to the source (14) NMOS device while negatively biasing the drain (22) of the PMOS device. In a particular embodiment, an integrated circuit device includes a CMOS circuit and a single-poly flash memory circuit. In a further embodiment, a DC-DC on-chip voltage converter produces the erase voltage from conventional CMOS voltage supplies.

5 Claims, 4 Drawing Sheets

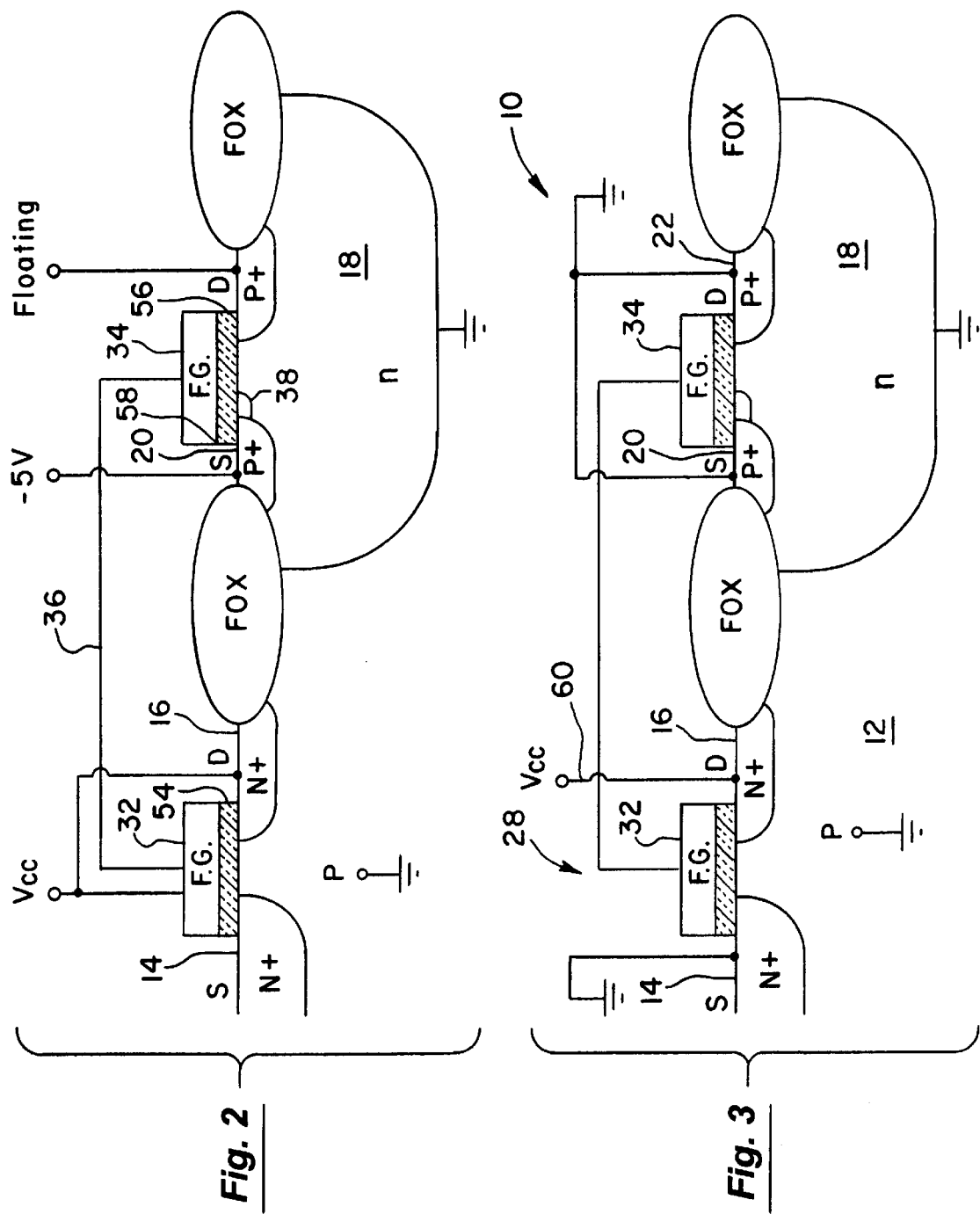

SINGLE-POLY FLASH MEMORY CELL FOR EMBEDDED APPLICATION AND RELATED METHODS

BACKGROUND OF THE INVENTION

The present invention relates to semiconductor devices, and more particularly to an electrically erasable-programmable read-only memory ("EEPROM") cell structure that is compatible with conventional complimentary metal-oxide-semiconductor ("CMOS") processes, and a method for making the same.

Many different types of integrated circuits ("ICs") have been developed for many different applications. CMOS ICs are used in many applications where logic or switching functions are desired because of the relatively low power requirements and high device density this type of technology allows. However, CMOS circuits are not the best choice or are not suitable for all the various functions an electronic product. Often, semiconductor devices containing only CMOS devices have been connected to other types of semiconductor devices, such as read-only memories ("ROMs") or high-power devices, such as a bipolar transistor. It is often desirable to combine many functions on a single device, or "chip", to reduce the number of chips required to produce a product.

One desirable combination is to include, or "embed", electrically erasable, programmable ROM ("EEPROM") within a chip that also has CMOS circuitry. EEPROMs will store information without needing electric power to be continuously applied, but can be programmed or re-programmed by applying appropriate voltages. Flash EEPROM, also known as flash memory, is particularly appealing because it can be relatively rapidly programmed to a desired configuration. Such memory may provide the basic operating system or microcode for a logic device, such as a microprocessor. Embedding flash memory in a CMOS device allows a single chip produced by a manufacturer to be configured for a variety of applications, and/or allows a single device to be configured by a user for different applications. Programming of the flash memory is typically done by downloading code from an external source, such as a computer.

While many conventional CMOS processes require only a single layer of polysilicon, many flash memory processes require multiple layers of polysilicon. In order to embed this type of flash memory into a CMOS device, several additional processing steps are required. These process steps result in higher cost, longer process times, and lower yields. Some circuit designs include repair circuit regions on the die in order to compensate for the reduced good-device yield. These repair circuits consume valuable area on the die, further increasing the cost of the eventual circuit. Fortunately, so-called "single poly" flash memory devices have been developed that are more easily combined with standard CMOS process flow.

Several different single-poly memory devices have been developed. Some single-poly memory cells are difficult to reliably program, read, or erase, while others degrade after a relatively few number of programming cycles, and others require relatively high voltages to program or erase the memory cell. The types of single-poly flash cells that require high program/erase voltages are undesirable for at least two reasons. First, the higher voltages require higher degrees of isolation, such as field oxide isolation, that consume additional die area. Second, it may be difficult to generate such a high voltage on the chip using charge-transfer voltage pump circuits, especially with sufficient current for flash memory applications, and it may be difficult and expensive to provide a higher voltage to the chip solely for flash memory applications, particularly in low-power or battery-operated devices.

Therefore, it is desirable to provide a single-poly memory device that can be fabricated with conventional CMOS process sequences and therefore can be easily embedded in a CMOS device. It is further desirable that the single-poly memory device be easily programmed and erased, and that an unduly high voltage is not required for operation of the device.

SUMMARY OF THE INVENTION

The present invention provides a single-poly memory device that can be fabricated with a conventional CMOS process sequence. A complimentary cell couples the floating gate of an NMOS device to the floating gate of a PMOS device. Each gate at least partially overlaps a source region and a drain region. A channel-stop region adjacent to the source of the PMOS device inhibits formation of a channel between the source and drain, and hence essentially eliminates current flow from the drain to the source in the PMOS device, even when a voltage is present between the source and drain and the floating gate has sufficient potential to otherwise initiate a channel.

The flash memory cell may be programmed, read, and erased using a combination of voltages normally present with a CMOS device, and a moderately boosted erase voltage. In a particular embodiment, an erase voltage less than about twice the positive bias voltage of the CMOS device (Vcc) is used in conjunction with a negative voltage, such as Vss, to globally erase an array of flash memory cells.

BRIEF DESCRIPTION OF THE DRAWINGS

FIG. 2 is a simplified representation of a device biasing configuration to program the flash memory device of FIG. 1;

FIG. 3 is a simplified representation of a device biasing configuration to read the flash memory device of FIG. 1;

DESCRIPTION OF THE SPECIFIC EMBODIMENTS

The present invention includes a memory device capable of being embedded in a single-poly CMOS IC and a method of operating the memory device. In a preferred embodiment, a channel stop region is fabricated under a PMOS gate by obliquely implanting n-type impurities. The topology of the device allows programming and erasing to be accomplished at relatively low voltages, while reliably retaining stored charge.

Figure 1A:
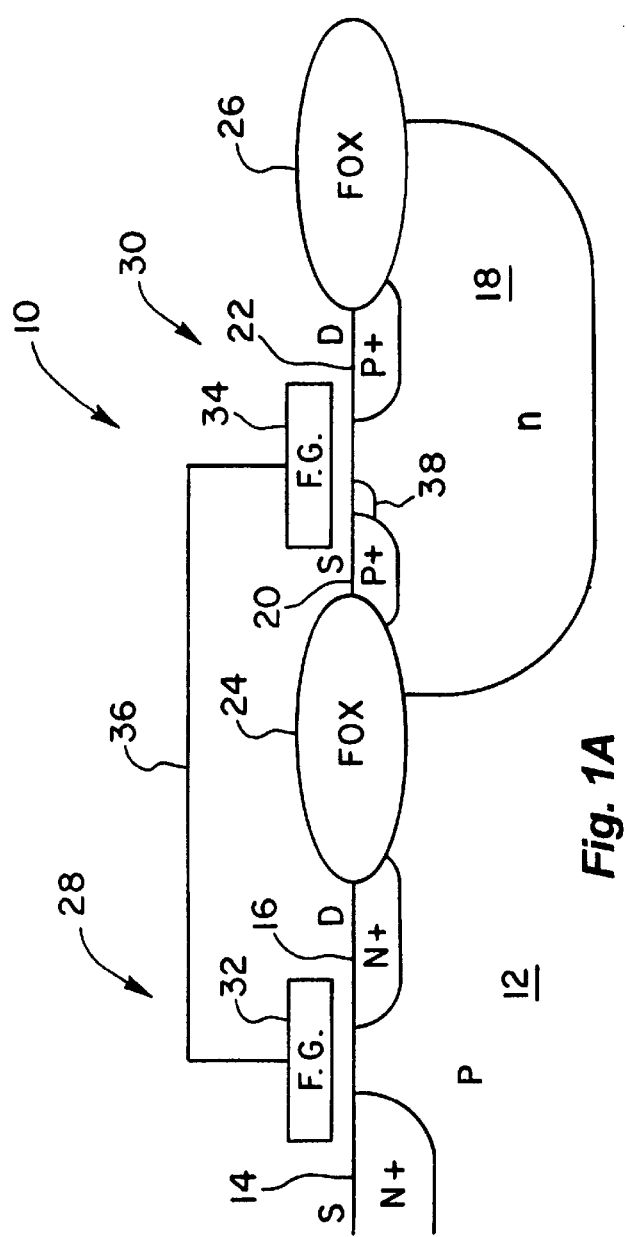
FIG. 1A is a simplified cross section of a flash memory device according to one embodiment of the present invention.

FIG. 1A is a simplified cross section of a portion of a flash memory cell 10 according to one embodiment of the present invention. It is understood that the type of semiconductor regions, device layout, and polarity of voltages are chosen solely for illustration, and that one of ordinary skill in the art would recognize other alternatives, variations, and modifications. A p-type substrate 12 has a high-voltage n+ source region 14 and n+ drain region 16 fabricated by conventional methods. It is understood that the "substrate" could be a bulk p-type substrate, a p-type epitaxial layer grown on an n-type or a p-type bulk substrate, or a p-well in an n-type layer or substrate.

The high-voltage n+ source region 14 may be subjected to voltages higher than the other junctions, but depending on the application may be formed as a typical n+ junction. For example, if the intended "high" voltage is about 8–9 volts, a typical n+ junction, that is, a junction similar to the n+ drain region 16, is sufficient, and no additional or special processing is required. In other applications, it may be desirable to optimize the n+ source region 14 for higher voltages.

An n-well 18 is formed in the p-type substrate, and a p+ source region 20 and p+ drain region 22 are also formed. Field oxide 24, 26 isolates the NMOS structure 28 from the PMOS structure 30 and also provides isolation against channels forming in the field regions underneath charged conductors.

The NMOS gate 32 and the PMOS gate 34 are both polysilicon and are formed in a single polysilicon deposition and patterning sequence. A conductor 36 directly electrically couples the NMOS gate to the PMOS gate, that is, there is a conductive current path from one gate to the other, as opposed to indirectly coupling, such as capacitively coupling. Both gates are floating, that is, they are not directly electrically coupled to a voltage or current source or sink on the IC, and at the same electrical potential. The conductor may be a polysilicon trace formed at the same time as the gates, or may be a metal or silicide conductor formed later in the fabrication sequence.

A channel stop region 38 is implanted underneath the PMOS gate 34. Normally, such a channel-stop region would be undesirable in a typical field-effect transistor ("FET") because it would resist the formation of a channel and impair the flow of current between the drain and the source. However, as will be discussed below, the PMOS structure is not a typical FET, and it is undesirable to have current flow in this fashion. Rather, it is believed that this channel-stop region facilitates band-to-band hot electron injection into the PMOS floating gate.

Figure 1B:
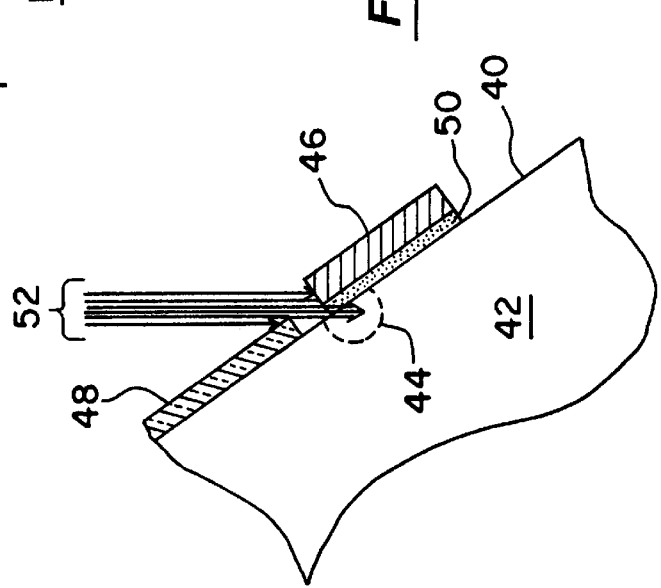
FIG. 1B is a simplified representation of an oblique ion implantation method to form a channel stop region underneath a gate region.

FIG. 1B shows a method for fabricating the channel-stop region. The cross section representation of the partially fabricated substrate has been simplified for purposes of illustration. N-type ions (represented by arrows) 52 are implanted at an oblique angle to the surface 40 of the substrate 42 (n-well). Implantation at this angle allows the channel-stop region 44 to be formed under the gate 46. An implantation mask layer 48 defines the desired implantation window in conjunction with the polysilicon gate 46, which is separated from the substrate by a very thin oxide layer 50, which may be less than about 100 Å thick. In the present case, the very thin oxide layer 50 is formed during CMOS gate oxide process and is essentially the same layer as the CMOS gate oxide. This implantation is preferably performed before the formation of the p+ source region (not shown), but may be formed after the source region, as well. For an n-well concentration of about $1\times10^{16}$ cm$^{-3}$ and a p+ source region concentration of about $5\times10^{19}$ cm$^{-3}$, the channel-stop implant region can have a concentration of between about $5\times10^{17}$–$1\times10^{19}$ cm$^{-3}$, preferably about $1\times10^{18}$ cm$^{-3}$. It is understood that the exemplary concentrations are the desired concentrations after the thermal history of the finished device, and that the initial implantation dose and energy depend on a multitude of factors, as is known in the art.

FIG. 2 is a simplified representation of a portion of a memory cell of an IC 10 biased to program, or write, information to the cell. Both the NMOS source 14 and NMOS drain 16 are biased to $V_{cc}$ (normally about 4.5–5.5 V). The NMOS gate 32 overlays a portion of the drain 16 and a portion of the source 14. This overlap, while generally undesirable in a conventional FET, capacitively couples the floating NMOS gate 32 to the drain 16 and the source 14. This capacitive coupling creates a field across the thin gate oxide 54, which is coupled to the NMOS floating gate 32 and the PMOS floating gate 34 through the conductor 36. The thin gate oxide 54 may be formed during a CMOS gate oxide process, for example, and may be less than about 100 Å.

A voltage of between about −4.5 to −5.5 V, preferably about −5V is applied to the PMOS source 20. The n-well region 18 is at ground potential. This forms a reverse-biased junction between the source 20 and the channel-stop region 38, both of which are relatively heavily doped. This heavy doping insures that the depletion region is fairly short, resulting in a high field gradient. This high field gradient acts upon any electrons present in the depletion region to strongly accelerate the electron to a high velocity, the velocity being generally parallel to the surface of the substrate. One model is that some electrons will be "deflected" by atoms or other features in the crystalline lattice, and the electrons that are deflected toward the floating gate 34 are attracted toward that gate by the capacitively coupled potential from the NMOS drain 16 and source 14. It is believed that the combination of the kinetic energy of the electrons with the electric attraction from the gate provide sufficient energy for some electrons to overcome the barrier of the thin oxide layer 56 and charge the floating gate(s). The thin oxide layer 56 is essentially the same layer as the thin gate oxide 54. It is further believed that the presence of a corner 58 of the PMOS gate 34 near the p-n junction region furthers the electron transfer by concentrating the electric field gradient in this region.

Another model for gate charging is that the high doping levels of the PMOS source 20 and the channel-stop region 38 results in at least partial degeneration of one or both halves of the p-n junction. Band-to-band electron tunneling may occur because donor states in one band may overlap the bottom of the conduction band. In such an overlapping condition, filled states and empty states appear opposite each other, separated by essentially the width of the depletion region. Thus, the conditions for electron tunneling are met: filled and empty states separated from each other by a narrow potential barrier of finite height. A small reverse bias allows electron tunneling from the filled states to the empty states. This mechanism is similar to a Zener effect, except that no bias is required to create the overlapping bands. As above, some of the tunneling (hot) electrons are believed to be scattered and swept through the thin gate oxide into the floating gate.

The actual mechanism by which the floating gate is charged may occur according to either mechanism, or by another mechanism, or by a combination of mechanisms. In any event, programming of the floating gate is accomplished using voltages normally found within the range of CMOS ICs, i.e. $V_{cc}$ and −5V. Programming typically takes place one cell at a time, so that the current draw from the −5V source is not excessive, and sufficient current is easily provided by standard available voltage sources.

FIG. 3 is a simplified representation of a portion of a memory cell of an IC 10 biased to read information from the cell. The PMOS source 20, PMOS drain 22, NMOS source 14, n-well 18 and substrate 12 are all grounded. A sense voltage 60, typically less than Vcc is applied to the NMOS drain 16. If the cell has been programmed, that is, if electrons have been transferred to the PMOS gate 34 and hence to the NMOS gate 32, no channel will form under the NMOS structure 28 and essentially no current will flow between the drain and the source. When the cell is erased by drawing electrons from the NMOS gate 32 and charging it with holes, a channel will form (e.g. by inducement) between the NMOS source 14 and NMOS drain 16, and current will flow from the positively biased drain to the grounded source. The amount of current flowing may be sensed according to well-known means to determine whether the floating gate is charged with electrons or not. If it is not charged, than measurable current will flow, if the floating gate is charged, than very little current (essentially no current) will flow. Because the floating gate retains the charge, the cell may be read repeatably.

Figure 4:
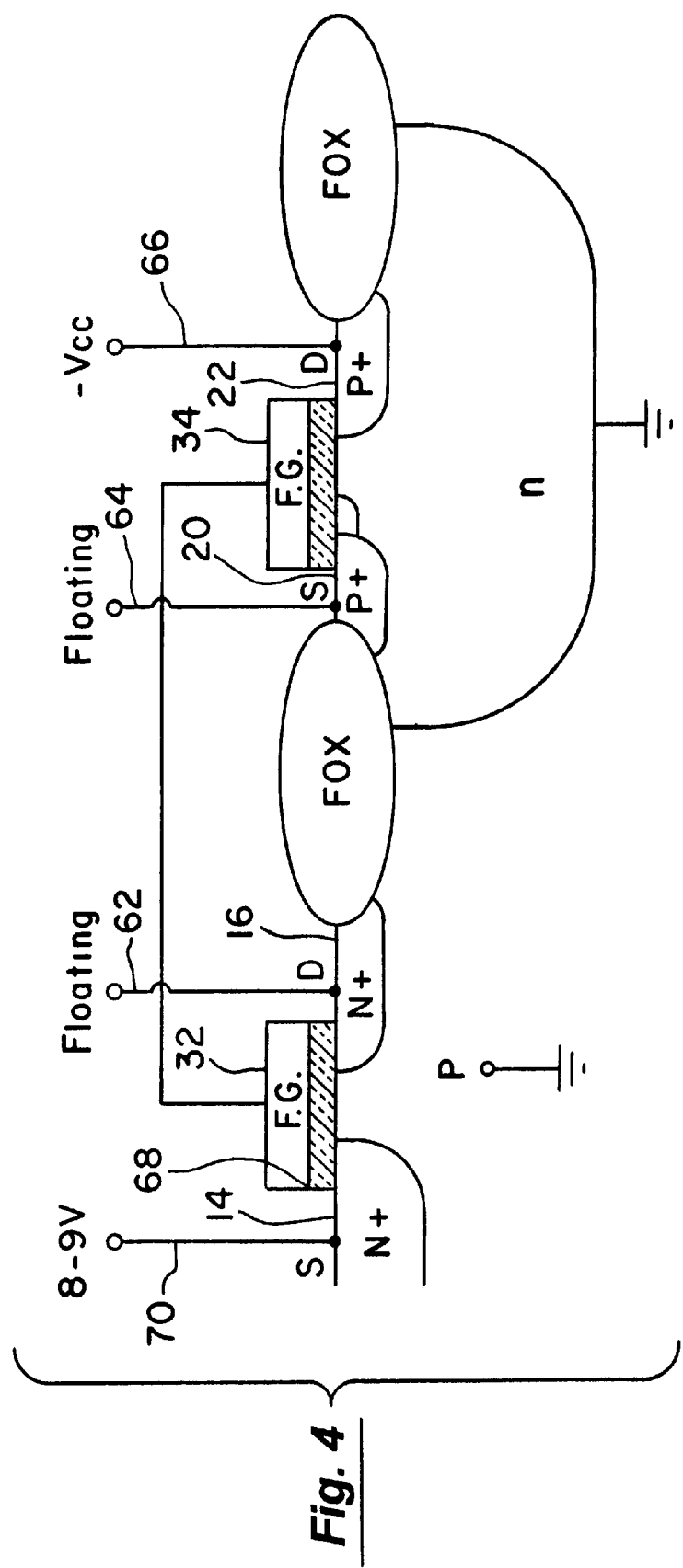
FIG. 4 is a simplified representation of a device biasing configuration to erase the flash memory device of FIG. 1.

FIG. 4 is a simplified representation of a portion of a memory cell of an IC 10 biased to erase information from the cell. It is believed the erase function is achieved by Fowler-Nordheim tunneling. This phenomenon is well-described in the art; therefore, a detailed discussion will not be provided herein. Unlike the programming operation discussed in conjunction with FIG. 2, above, the erase operation is typically done on several cells at once, in preparation for writing to each cell in a subsequent operation. This global or partial global erase function is one of the desirable characteristics of a "flash" memory device, as if each cell needed to be individually erased, the speed of reprogramming would increase. Some flash memory devices require an erase supply that not only produces a relatively high voltage, but also that has the ability to supply a significant amount of current. While charge-transfer pump circuits are well-known for providing "boosted" or "pumped" voltages on a chip, such circuits are often used for relatively small voltage boosts, typically one or two times a device threshold voltage over Vcc, and typically cannot supply much current at the boosted voltage. Some flash memory products operate at erase voltages in the range of 14–18V. Not only does this require a high-voltage source or pump, it also requires the isolation structures of the IC to withstand such high voltages. Fabricating isolation structures of such size and thickness complicates the fabrication process by increasing the time required for oxide growth processes, for example, and consumes valuable chip area.

The present device achieves a memory cell erase at a much lower voltage. The NMOS drain 16 and the PMOS source 20 are both allowed to float 62, 64. A voltage of Vss (typically −Vcc) 66 is applied to the PMOS drain 22. This voltage capacitively couples to the PMOS floating gate 34, assisting in the transfer of electrons from the NMOS floating gate 32 to the NMOS source 14. It is believed that the overhang of a corner 68 of the NMOS gate 32 over the source 14 also contributes to the charge transfer from the gate to the source, as discussed above in relation to the programming operation described in conjunction with FIG. 2.

Figure 5:
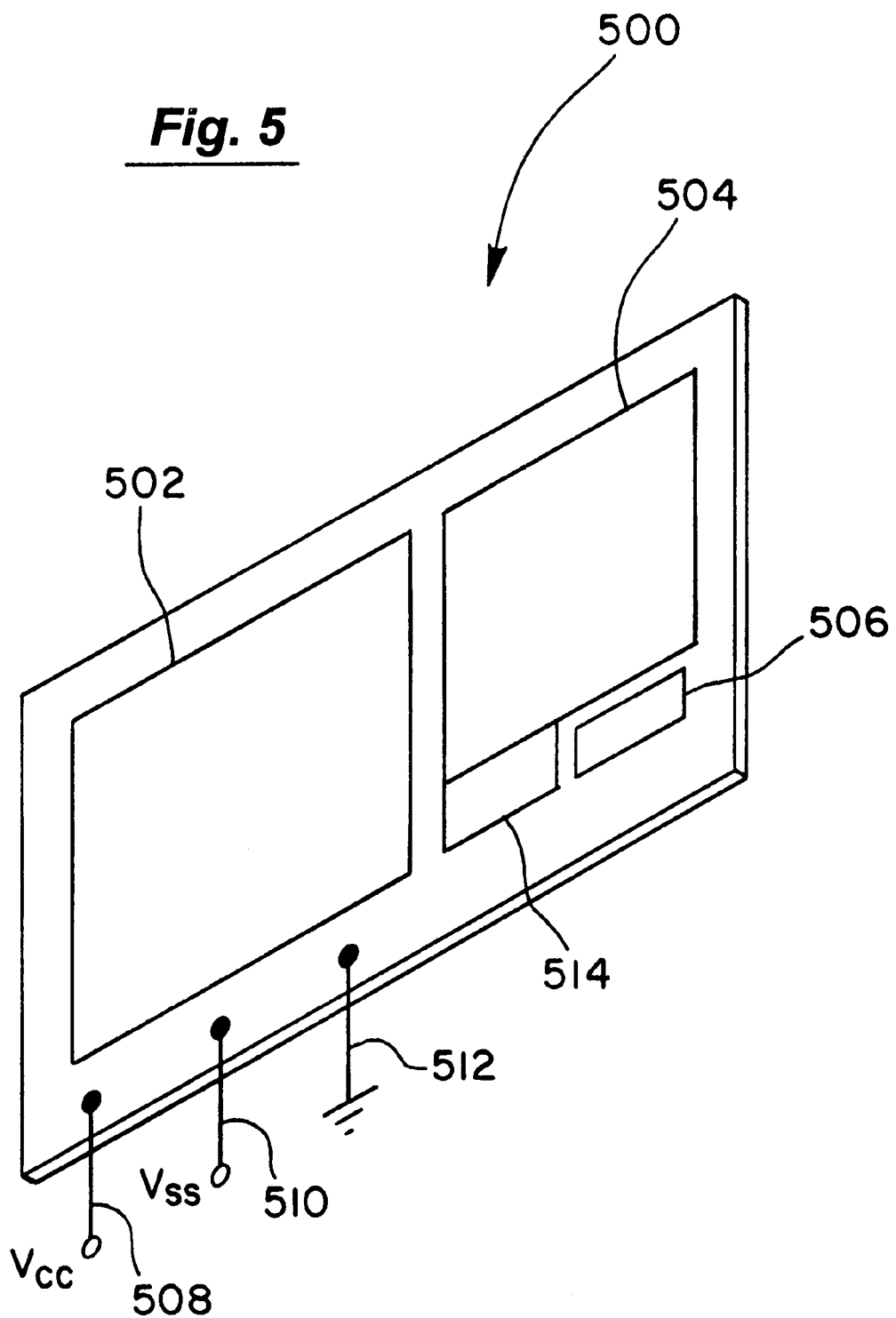
FIG. 5 is a simplified representation of an IC chip incorporating a CMOS circuit and a flash memory.

FIG. 5 is a simplified representation of an IC chip 500 incorporating a CMOS circuit 502 with a flash memory circuit 504 that is powered by an on-chip DC-DC voltage converter circuit 506. The flash memory circuit is made and operated according to the descriptions given above, for example. The IC chip 500 is provided with standard CMOS connections, including Vcc 508, Vss 510, and ground 512, and without a higher voltage connection. The on-chip DC-DC voltage converter circuit uses the resident voltage levels (i.e. Vcc, Vss, and ground) to produce an erase voltage of about twice Vcc. Of course, this voltage may be used for other purposes on the circuit in addition to the erase function. An optional memory repair circuit 514 (a circuit with redundant memory cells to perform as alternates to bad cells in a memory array) may be included. The single-poly structure of the flash memory circuit may be formed by the same process sequence that is used to form the CMOS circuit 502. The yield of this process may be high enough in some applications that a dedicated repair circuit 514 is not needed, particularly in embedded applications that require a relatively small memory size, such as 8K×8 or smaller.

While the above is a complete description of specific embodiments of the present invention, various modifications, variations, and alternatives may be employed. For example, the recited voltage levels could be varied to accommodate different design rules (circuit dimensions). These equivalents and alternatives are intended to be included within the scope of the present invention. Therefore, the scope of this invention should not be limited to the embodiments described, and should instead be defined by the following claims.

What is claimed is:

1. A method of biasing a flash memory device, the method comprising:

(a) applying a first voltage of a first polarity to a first source region and a first drain region, the first source region overlapping a first portion of a first gate structure, and the first drain region overlapping a second portion of the first gate structure, the first gate structure electrically floating and being directly electrically connected to a second gate structure;

(b) applying a second voltage of a second polarity, the second polarity being opposite the first polarity, to a second source region overlapping a first portion of the second gate structure; and (c) electrically disconnecting a second drain region so that the second drain region electrically floats, the second drain region overlapping a second portion of the second gate structure,
   to transfer electronic charge to the second gate structure, the electronic charge being distributed between the second gate structure and the first gate structure and causing the first gate structure to become negatively charged.

2. The method of claim 1 wherein the first voltage is Vcc.

3. The method of claim 2 wherein Vcc is less than or equal to about 5 V.

4. The method of claim 2 wherein the second voltage is about −Vcc.

5. The method of claim 1 wherein the transfer of electronic charge to the second gate structure programs the flash memory device.

* * * * *